United States Patent
Ito et al.

(10) Patent No.: US 11,214,721 B2
(45) Date of Patent: Jan. 4, 2022

(54) THERMALLY CONDUCTIVE COMPOSITE SILICONE RUBBER SHEET AND METHOD FOR MANUFACTURING SAME

(71) Applicant: SHIN-ETSU CHEMICAL CO., LTD., Tokyo (JP)

(72) Inventors: Takanori Ito, Annaka (JP); Akihiro Endo, Annaka (JP); Yasuhisa Ishihara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 142 days.

(21) Appl. No.: 16/341,838

(22) PCT Filed: Oct. 6, 2017

(86) PCT No.: PCT/JP2017/036461
§ 371 (c)(1),
(2) Date: Apr. 12, 2019

(87) PCT Pub. No.: WO2018/070351
PCT Pub. Date: Apr. 19, 2018

(65) Prior Publication Data
US 2019/0316018 A1  Oct. 17, 2019

(30) Foreign Application Priority Data

Oct. 14, 2016  (JP) .............................. JP2016-202641

(51) Int. Cl.
| | | |
|---|---|---|
| B32B 27/00 | (2006.01) | |
| C09K 5/14 | (2006.01) | |
| C09J 7/25 | (2018.01) | |
| C09J 7/29 | (2018.01) | |
| C09J 7/38 | (2018.01) | |
| C09J 11/04 | (2006.01) | |
| C09J 11/08 | (2006.01) | |
| F28F 21/06 | (2006.01) | |
| H01L 23/373 | (2006.01) | |
| B32B 27/28 | (2006.01) | |
| B32B 27/08 | (2006.01) | |

(52) U.S. Cl.
CPC .................................. *C09K 5/14* (2013.01); *C09J 7/25* (2018.01); *C09J 7/29* (2018.01); *C09J 7/385* (2018.01); *C09J 11/04* (2013.01); *C09J 11/08* (2013.01); *F28F 21/065* (2013.01); *H01L 23/3737* (2013.01); *B32B 27/00* (2013.01); *B32B 27/08* (2013.01); *B32B 27/283* (2013.01); *C09J 2203/326* (2013.01); *C09J 2301/408* (2020.08); *C09J 2301/41* (2020.08); *C09J 2400/143* (2013.01); *C09J 2433/00* (2013.01); *C09J 2483/006* (2013.01)

(58) Field of Classification Search
CPC ........... B32B 27/08; B32B 27/283; C09J 7/29
See application file for complete search history.

(56) References Cited

U.S. PATENT DOCUMENTS

| | | | |
|---|---|---|---|
| 3,886,126 A | | 5/1975 | McKenna, Jr. et al. |
| 4,265,775 A | | 5/1981 | Aakalu et al. |
| 2002/0011660 A1 | | 1/2002 | Ebihara et al. |
| 2007/0055006 A1 | | 3/2007 | Kim et al. |
| 2007/0117918 A1 | | 5/2007 | Kim et al. |
| 2008/0266746 A1 | * | 10/2008 | Handa ................. H01L 21/6831 361/234 |
| 2010/0129569 A1 | | 5/2010 | Park et al. |
| 2014/0150844 A1 | * | 6/2014 | Azechi ..................... H01B 1/22 136/244 |
| 2015/0037577 A1 | * | 2/2015 | Kataoka ............... C09J 133/066 428/354 |

FOREIGN PATENT DOCUMENTS

| | | |
|---|---|---|
| CN | 132260478 A | 11/2011 |
| CN | 105131859 A | 12/2015 |
| EP | 2 527 885 A2 | 11/2012 |
| EP | 2 548 932 A2 | 1/2013 |

(Continued)

OTHER PUBLICATIONS

Offer of Information issued May 15, 2019, in Japanese Patent Application No. 2018-544987.
International Search Report, issued in PCT/JP2017/036461, PCT/ISA/210, dated Jan. 16, 2018.
Written Opinion of the International Searching Authority, issued in PCT/JP2017/036461, PCT/ISA/237, dated Jan. 16, 2018.
Extended European Search Report for European Application No. 17859719.1, dated May 25, 2020.
Chinese Office Action and Search Report for Chinese Application No. 201780063276.6, dated Feb. 2, 2021.

*Primary Examiner* — Margaret G Moore
(74) *Attorney, Agent, or Firm* — Birch, Stewart, Kolasch & Birch, LLP

(57) ABSTRACT

Provided is a thermally conductive composite silicone rubber sheet formed by laminating an acrylic pressure-sensitive adhesive layer on one side of a non-pressure-sensitive adhesive/high-hardness thermally conductive silicone rubber sheet, wherein the acrylic pressure-sensitive adhesive layer is a cured product of an acrylic pressure-sensitive adhesive composition containing: an acrylic pressure-sensitive adhesive made of a polymer of a monomer mixture in which 5-50 mol % of hydroxyl group-containing monomers are contained in all of the constituent monomers; and 0.05-5 parts by mass of a chelate-based curing agent with respect to 100 parts by mass of the acrylic pressure-sensitive adhesive, and the thermally conductive silicone rubber sheet has a thermally conductive silicone rubber layer which, as a cured product of a thermally conductive silicone composition containing a thermally conductive filler, has a durometer A hardness of 60-96.

2 Claims, No Drawings

(56) References Cited

FOREIGN PATENT DOCUMENTS

| | | | |
|---|---|---|---|
| JP | 56-161140 | A | 12/1981 |
| JP | 57-36302 | A | 2/1982 |
| JP | 63-130686 | A | 6/1988 |
| JP | 6-155517 | A | 6/1994 |
| JP | 11-307697 | A | 11/1999 |
| JP | 2001-348542 | A | 12/2001 |
| JP | 2005-57283 | A | 3/2005 |
| JP | 2009-507255 | A | 2/2009 |
| JP | 2009-516048 | A | 4/2009 |
| JP | 2009-519372 | A | 5/2009 |
| JP | 2009-132752 | A | 6/2009 |
| JP | 2012-106409 | A | 6/2012 |
| JP | 2013-194085 | A | 9/2013 |
| JP | 2014-193598 | A | 10/2014 |

\* cited by examiner

THERMALLY CONDUCTIVE COMPOSITE SILICONE RUBBER SHEET AND METHOD FOR MANUFACTURING SAME

TECHNICAL FIELD

This invention relates to a heat-conductive composite silicone rubber sheet which is suited as a heat-dissipating insulating sheet for heat-generating electronic parts and the like and which has excellent workability, reworkability, and heat dissipation properties, and a method for preparing the same.

BACKGROUND ART

Heat-generating electronic parts such as power transistors and thyristors for various electronic devices and integrated circuit components such as IC, LSI, CPU, and MPU lose their performance by their own heat release. Also, heat release causes to shorten the lifetime of such components. The components are carefully arranged in the electronic device for effective heat dissipation. Efforts have also been made to provide cooling fins for forced-air cooling of certain parts or whole device and to provide a heat-dissipating sheet via which heat from an integrated circuit component is released to a cooling member, substrate or casing.

In conjunction with the recent higher integration of electronic devices, typically personal computers, the heat-generating electronic parts and the integrated circuit components in the devices generate more heat. The prior art forced-air cooling systems and heat-dissipating sheets are sometimes insufficient in the cooling and heat dissipation of these parts and components. Especially for portable laptop or notebook type personal computers, cooling means other than the forced-air cooling system is needed. The prior art heat-dissipating sheets fail to fully dissipate the heat generated from components to printed boards because the printed boards on which components are formed are made of glass-reinforced epoxy resins or polyimide resins having poor thermal conductivity. For this reason, radiators such as radiating fins of natural cooling or forced cooling type and heat pipes are placed near the components to dissipate heat generated from the components to the radiators via heat-dissipating media.

The heat-dissipating media used for improving thermal conduction between the component and the radiator are heat-dissipating heat-conductive greases and heat-dissipating sheets of about 0.2 to about 10.0 mm thick. For example, the heat-dissipating heat-conductive grease known from Patent Document 1 (JP-A S57-36302) is formed by blending silicone oil with a heat-conductive filler such as silica fiber, zinc oxide or aluminum nitride. This grease has many problems including a risk of oil bleeding, inefficient assembling work of electronic parts, and a decline of thermal conductivity due to interstices generated by thermal history. Of the heat-dissipating sheets, the sheet formed by reinforcing a heavy load, high-hardness silicone rubber layer with a cloth reinforcement such as glass cloth is well known Patent Document 2 (JP-A S56-161140). Heat-dissipating sheets of this type are very useful because they contain a high-hardness rubber layer which plays both the roles of ensuring thermal conductivity and insulating properties. However, since the heat-dissipating sheet has substantially no surface tack, it is very difficult to mount and secure the sheet to a heat-generating part.

As heat-dissipating sheets adapted for efficient mounting and securing work, there are commercially available composite heat-dissipating sheets comprising a high-hardness heat-conductive silicone rubber sheet, a pressure-sensitive adhesive layer laid on one surface or both surfaces of the silicone rubber sheet, and a protective release sheet such a release paper on the pressure-sensitive adhesive layer for protection. In this composite heat-dissipating sheet, the pressure-sensitive adhesive layer sometimes has a stronger bonding force (or adhesion strength) than the desired bonding force. When misalignment occurs during mounting, reworking may be difficult, or if possible, the pressure-sensitive adhesive layer can be broken during reworking. A silicone rubber sheet having a silicone pressure-sensitive adhesive layer on one surface or both surfaces thereof has the problem that pressure-sensitive adhesive components in the silicone pressure-sensitive adhesive layer migrate inside the silicone rubber sheet over time, leading to a reduced surface bonding force. In order to avoid this phenomenon, the silicone pressure-sensitive adhesive layer may be formed thick. Thicker silicone pressure-sensitive adhesive layers interfere with reworking and fail to provide the desired heat dissipation performance because of poor thermal conductivity of the silicone pressure-sensitive adhesive.

Patent Document 3 (JP-A 2001-348542) discloses a heat-dissipating sheet which has an acrylic pressure-sensitive adhesive layer, which is better in thermal conductivity than a silicone pressure-sensitive adhesive layer, laid on one surface or both surfaces of a heat-conductive silicone rubber sheet. It is prepared by curing an acrylic pressure-sensitive adhesive layer on a separator, applying a heat-conductive silicone rubber sheet material thereon, and curing the material. These steps are cumbersome. Also, it is difficult to incorporate a reinforcement such as glass cloth inside the heat-dissipating rubber sheet for the purpose of improving the strength. Furthermore, in order to achieve tight adhesion between the acrylic pressure-sensitive adhesive layer and the heat-conductive silicone rubber sheet, a primer must be added to the acrylic pressure-sensitive adhesive layer or a pressure-sensitive adhesive component must be added to the silicone rubber sheet material. These components will bleed over time, leading to contamination of an actual device.

As the curing agent in the acrylic pressure-sensitive adhesive layer, isocyanate curing agents, epoxy curing agents, and chelate curing agents are generally used. Patent Document 4 (JP-A 2009-132752) proposes the combined use of an isocyanate curing agent and a chelate curing agent for an acrylic pressure-sensitive adhesive containing a carboxyl-bearing monomer. The isocyanate curing agent has the problem that it can become an addition poison to inhibit addition cure of silicone heat-dissipating sheet, and is thus unsuitable for use in layers laid on the silicone heat-dissipating sheet. Some acrylic pressure-sensitive adhesives containing a carboxyl-containing monomer leave unreacted carboxyl groups which can cause cracking of silicone polymer. Thus the acrylic pressure-sensitive adhesives are not preferred from the aspect of reliability.

Patent Document 5 (JP-A H06-155517) discloses a heat-dissipating sheet comprising a high-hardness heat-conductive silicone rubber sheet reinforced with a reinforcement as described above and a low hardness heat-conductive silicone rubber layer laid thereon. However, in the case of this composite heat-dissipating sheet, sheets having a total thickness of less than 0.45 mm are unavailable due to production issues. Even though the low hardness heat-conductive silicone rubber layer has desirably high thermal conductivity, the composite sheet has the drawback that the overall composite sheet cannot be thin and its thermal resistance is inevitably substantial. In prior art composite heat-dissipating sheets, a low-hardness sheet is often overlaid with a high-hardness sheet in order to improve workability. Typically, a thick low-hardness layer is combined with a thin high-hardness layer. In this structure, however, since the low-hardness layer can be compressed and deformed under pressure, it may be difficult to maintain the space and thus difficult to guarantee insulation.

Patent Document 6 (JP-A 2014-193598) discloses a heat-dissipating sheet having a thin low-hardness weakly adhesive heat-conductive silicone rubber layer laid thereon. The heat-dissipating sheet is improved in thermal conductivity due to tight contact at no sacrifice of workability and insulation guarantee and given workability and reworkability by the weak tack. Although the low-hardness silicone rubber layer is reworkable, it has a very weak bonding force due to poor cohesive force and is difficult to temporarily secure to heat-generating parts under certain mounting conditions. Patent Document 6 refers nowhere to a release force, which is an important index of bonding force, as measured by peeling at a pulling rate of 300 mm/min according to JIS C 2107.

Although the high-hardness silicone heat-dissipating sheet has not only high heat dissipation properties, but also excellent insulation reliability because of its strength as discussed above, it is disadvantageous in mounting workability. When a pressure-sensitive adhesive layer, especially silicone pressure-sensitive adhesive layer is applied to one surface or both surfaces of the silicone rubber sheet as a means for improving mounting workability, pressure-sensitive adhesive components can migrate inside the silicone heat-dissipating sheet over time, leading to a loss of bonding force. The use of an acrylic pressure-sensitive adhesive layer is more advantageous in view of thermal conductivity than the use of a silicone pressure-sensitive adhesive layer. However, in order to achieve tight adhesion to the silicone heat-dissipating sheet, cumbersome procedures using primer components are needed. When an isocyanate curing agent is used for curing an acrylic pressure-sensitive adhesive layer, it can become an addition poison to cause undercure of heat-dissipating silicone rubber sheet. In some acrylic pressure-sensitive adhesives containing a carboxyl-bearing monomer, remaining unreacted carboxyl groups may cause cracking of silicone polymer.

The composite sheet containing low and high-hardness rubber layers is difficult to form a thin structure and difficult to insure the space and insulation under high pressure. It also has drawbacks such as a complicated manufacturing process and unavoidable change with time. The low-hardness layer has too low cohesive force to provide the desired bonding property under mounting conditions. In some cases, temporary securement to an actual device is insufficient.

PRIOR ART DOCUMENTS

Patent Documents

Patent Document 1: JP-A S57-36302
Patent Document 2: JP-A S56-161140
Patent Document 3: JP-A 2001-348542
Patent Document 4: JP-A 2009-132752
Patent Document 5: JP-A H06-155517
Patent Document 6: JP-A 2014-193598

SUMMARY OF INVENTION

Technical Problem

An object of the invention is to provide a heat-conductive composite silicone rubber sheet which has excellent thermal conductivity, strength, and insulating properties, and meets all factors including sufficient bonding force to an actual device, low thermal resistance, reworkability, and long-term bonding force reliability, and a method for preparing the same.

Solution to Problem

The inventors have found that a heat-conductive composite silicone rubber sheet which has excellent workability, bonding force to an actual device, low thermal resistance, reworkability, insulation guarantee, and long-term bonding force reliability can be obtained by a simple production process comprising the steps of providing a non-adhesive high-hardness heat-conductive silicone rubber sheet including a heat-conductive silicone rubber layer which is formed by curing a heat-conductive silicone composition containing a heat-conductive filler and having a cured hardness of 60 to 96 on Durometer A scale, the silicone rubber sheet preferably having a thickness of 50 to 900 μm, applying an acrylic pressure-sensitive adhesive composition comprising 100 parts by weight of an acrylic pressure-sensitive adhesive containing 5 to 50 mol % of a hydroxyl-containing monomer and 0.05 to 5 parts by weight of a chelate curing agent to one surface of the silicone rubber sheet, and heat curing to shape an acrylic pressure-sensitive adhesive layer preferably having a thickness of 2 to 40 μm on the silicone rubber sheet.

Accordingly, this invention provides the following thermally conductive composite silicone rubber sheet and method for manufacturing same.

[1]
A heat-conductive composite silicone rubber sheet comprising a non-adhesive high-hardness heat-conductive silicone rubber sheet and an acrylic pressure-sensitive adhesive layer laid on one surface of the silicone rubber sheet, the non-adhesive silicone rubber sheet including a heat-conductive silicone rubber layer which is a cured product of a heat-conductive silicone composition containing a heat-conductive filler, the cured product having a hardness of 60 to 96 on Durometer A scale, and the acrylic pressure-sensitive adhesive layer being a cured product of an acrylic pressure-sensitive adhesive composition comprising 100 parts by weight of an acrylic pressure-sensitive adhesive composed of a polymer obtained from a monomer mixture containing 5 to 50 mol % of a hydroxyl-containing monomer, and 0.05 to 5 parts by weight of a chelate curing agent.

[2]
The heat-conductive composite silicone rubber sheet of [1] wherein the acrylic pressure-sensitive adhesive composition further comprises 0.05 to 5 parts by weight of a tackifier resin.

[3]
The heat-conductive composite silicone rubber sheet of [1] or [2] wherein the acrylic pressure-sensitive adhesive layer has a thickness of 2 to 40 μm.

[4]
The heat-conductive composite silicone rubber sheet of any one of [1] to [3] to wherein the hydroxyl-containing monomer is selected from 2-hydroxyethyl (meth)acrylate, 2-hydroxypropyl (meth)acrylate, 2-hydroxybutyl (meth)acrylate, and ethyl 2-(hydroxymethyl) acrylate.

[5]
The heat-conductive composite silicone rubber sheet of any one of [1] to [4] wherein the monomer mixture contains the hydroxyl-containing monomer and a hydroxyl-free alkyl (meth)acrylate.

[6]
The heat-conductive composite silicone rubber sheet of any one of [1] to [5] wherein the chelate curing agent is an aluminum chelate curing agent.

[7]
The heat-conductive composite silicone rubber sheet of any one of [1] to [6] wherein the non-adhesive high-hardness heat-conductive silicone rubber sheet further includes an intermediate reinforcing layer of glass cloth.

[8]
The heat-conductive composite silicone rubber sheet of [7] wherein the glass cloth is sealed with a heat-conductive silicone resin.

[9]
The heat-conductive composite silicone rubber sheet of any one of [1] to [8] which has a release force of 0.05 to 1.0 (N/25 mm) as determined by attaching the heat-conductive composite silicone rubber sheet on its acrylic pressure-sensitive adhesive layer to a stainless steel plate, allowing it to stand at 25° C. for 30 minutes, peeling the silicone rubber sheet from the stainless steel plate at a pulling rate of 300 mm/min, and measuring the force required for peeling, according to JIS C 2107.

[10]
The heat-conductive composite silicone rubber sheet of any one of [1] to [9] wherein the heat-conductive silicone rubber layer has a thermal conductivity of at least 1.0 W/m·K.

[11]
The heat-conductive composite silicone rubber sheet of any one of [1] to [10] wherein the acrylic pressure-sensitive adhesive layer is covered on its surface with a protective sheet, the heat-conductive composite silicone rubber sheet being wound up in a roll form.

[12]
A method for preparing the heat-conductive composite silicone rubber sheet of any one of [1] to [11], comprising the steps of directly applying the acrylic pressure-sensitive adhesive composition comprising an acrylic pressure-sensitive adhesive and a chelate curing agent onto one surface of the non-adhesive high-hardness heat-conductive silicone rubber sheet, and heat curing the acrylic pressure-sensitive adhesive composition for shaping.

Advantageous Effects of Invention

The heat-conductive composite silicone rubber sheet has excellent workability, insulation guarantee, and thermal conductivity because it includes a high-hardness high-strength non-adhesive heat-conductive silicone rubber sheet, which is overlaid with an acrylic pressure-sensitive adhesive layer having better thermal conductivity than a silicone pressure-sensitive adhesive layer. The heat-conductive composite silicone rubber sheet serves as a heat-dissipating sheet which exerts good adhesion to an actual device and improved workability at no sacrifice of low thermal resistance and insulation guarantee. Since the acrylic pressure-sensitive adhesive layer is not compatible with the non-adhesive high-hardness heat-conductive silicone rubber sheet, it experiences a minimal change with time of bonding force. The acrylic pressure-sensitive adhesive layer used herein is shaped by directly applying a coating solution of the acrylic pressure-sensitive adhesive composition containing a hydroxyl-containing acrylic pressure-sensitive adhesive and a chelate curing agent to the non-adhesive high-hardness heat-conductive silicone rubber sheet. Therefore, the acrylic pressure-sensitive adhesive layer tightly bonded to the heat-conductive silicone rubber sheet is obtainable by a simpler process than the prior art overlaying method using a primer.

DESCRIPTION OF EMBODIMENTS

The invention is described in detail below.

The heat-conductive composite silicone rubber sheet is defined as comprising a non-adhesive high-hardness heat-conductive silicone rubber sheet and an acrylic pressure-sensitive adhesive layer laid on one surface of the silicone rubber sheet.

[Non-Adhesive High-Hardness Heat-Conductive Silicone Rubber Sheet]

The non-adhesive high-hardness heat-conductive silicone rubber sheet includes a heat-conductive silicone rubber layer which is formed by curing a heat-conductive silicone composition containing a heat-conductive filler and has a cured hardness of 60 to 96 on Durometer A scale.

[Heat-Conductive Silicone Composition]

The heat-conductive silicone composition should contain an inorganic filler and preferably contains (a) an organopolysiloxane, (b) a curing agent, and (c) a heat-conductive filler.

[(a) Organopolysiloxane]

The organopolysiloxane as component (a) has the average compositional formula (1).

$$R^1_a SiO_{(4-a)/2} \quad (1)$$

Herein $R^1$ which may be the same or different is a unsubstituted or substituted monovalent hydrocarbon group of 1 to 18 carbon atoms, preferably 1 to 10 carbon atoms, and more preferably 1 to 8 carbon atoms and $a$ is a positive number of 1.90 to 2.05.

In formula (1), examples of $R^1$ include alkyl groups such as methyl, ethyl, propyl, butyl, pentyl, hexyl, heptyl, octyl, nonyl, decyl, and octadecyl; cycloalkyl groups such as cyclopentyl and cyclohexyl; aryl groups such as phenyl, tolyl, xylyl, and naphthyl; aralkyl groups such as benzyl, phenethyl, and 3-phenylpropyl; haloalkyl groups such as 3,3,3-trifluoropropyl and 3-chloropropyl; and alkenyl groups such as vinyl, allyl, butenyl, pentenyl, and hexenyl.

Preferred examples of the organopolysiloxane (a) include organopolysiloxanes having a backbone consisting of dimethylsiloxane units, or the backbone in which at least one methyl group is replaced by a vinyl, phenyl or 3,3,3-trifluoropropyl group. The organopolysiloxane is preferably capped at a molecular chain end with a triorganosilyl group or hydroxyl group. Examples of the triorganosilyl group include trimethylsilyl, dimethylvinylsilyl, and trivinylsilyl.

Component (a) preferably has a degree of polymerization in a range of 20 to 12,000, more preferably 50 to 10,000. Component (a) may be either oil or gum-like and selected in accordance with a particular shaping technique of the heat-conductive silicone composition. Notably, the degree of polymerization may be determined as a number average degree of polymerization by gel permeation chromatography (GPC) analysis versus polystyrene standards (the same applies hereinafter).

When the curing agent as component (b) described below is an addition reaction-cure type combination of an organohydrogenpolysiloxane and a platinum-based catalyst, the organopolysiloxane (a) preferably has at least two, preferably 3 to 50 silicon-bonded alkenyl groups per molecule. If the content of silicon-bonded alkenyl is below the range, the resulting composition may cure insufficiently. The silicon-bonded alkenyl group is preferably vinyl. The silicon-bonded alkenyl group may be present at the end and/or at the side chain of the molecular chain. The organopolysiloxane (a) should preferably have at least one silicon-bonded alkenyl group at the end of the molecular chain.

In this case, examples of the organopolysiloxane (a) include
trimethylsiloxy-endcapped dimethylsiloxane/methylvinylsiloxane copolymers,
trimethylsiloxy-endcapped methylvinylpolysiloxane,
trimethylsiloxy-endcapped dimethylsiloxane/methylvinylsiloxane/methylphenylsiloxane copolymers,
dimethylvinylsiloxy-endcapped dimethylpolysiloxane,
dimethylvinylsiloxy-endcapped methylvinylpolysiloxane,
dimethylvinylsiloxy-endcapped dimethylsiloxane/methylvinylsiloxane copolymers,
dimethylvinylsiloxy-endcapped dimethylsiloxane/methylvinylsiloxane/methylphenyl-siloxane copolymers, and
trivinylsiloxy-endcapped dimethylpolysiloxane.
The organopolysiloxanes may be used alone or in admixture of two or more.

When the curing agent (b) is an organic peroxide, the organopolysiloxane (a), which is not particularly limited, preferably has at least two alkenyl groups per molecule.

In this case, examples of the organopolysiloxane (a) include dimethylvinylsiloxy-endcapped dimethylpolysiloxane, methylphenylvinylsiloxy-endcapped dimethylpolysiloxane, dimethylvinylsiloxy-endcapped dimethylsiloxane/methylphenylsiloxane copolymers, dimethylvinylsiloxy-endcapped dimethylsiloxane/methylvinylsiloxane copolymers, trimethylsiloxy-endcapped dimethylsiloxane/methylvinylsiloxane copolymers, dimethylvinylsiloxy-endcapped methyl(3,3,3-trifluoropropyl)polysiloxane, silanol-endcapped dimethylsiloxane/methylvinylsiloxane copolymers, and silanol-endcapped dimethylsiloxane/methylvinylsiloxane/methylphenylsiloxane copolymers. The organopolysiloxanes may be used alone or in admixture of two or more.

[(b) Curing Agent]

Hydrosilylation curing agents and organic peroxides may be used as the curing agent (b).

When the curing agent (b) is a hydrosilylation curing agent, it may be a combination of an organohydrogenpolysiloxane having on average at least 2, preferably 5 to 100 silicon-bonded hydrogen groups (i.e., SiH groups) and a platinum-based catalyst.

The organohydrogenpolysiloxane serves as a crosslinker for addition reaction with alkenyl groups on component (a).

Examples of the organohydrogenpolysiloxane include
trimethylsiloxy-endcapped methylhydrogenpolysiloxane,
trimethylsiloxy-endcapped dimethylsiloxane/methylhydrogensiloxane copolymers,
trimethylsiloxy-endcapped dimethylsiloxane/methylhydrogensiloxane/methylphenyl-siloxane copolymers,
dimethylhydrogensiloxy-endcapped dimethylpolysiloxane,
dimethylhydrogensiloxy-endcapped dimethylsiloxane/methylhydrogensiloxane copolymers,
dimethylhydrogensiloxy-endcapped dimethylsiloxane/methylphenylsiloxane copolymers,
and dimethylhydrogensiloxy-endcapped methylphenylpolysiloxane.
The organohydrogenpolysiloxane may be used alone or in admixture of two or more.

The content of the organohydrogenpolysiloxane is typically 0.1 to 4 moles, preferably 0.3 to 2 moles of silicon atom-bonded hydrogen atoms (i.e., SiH group) in the organohydrogenpolysiloxane per mole of silicon-bonded alkenyl groups in component (a). If the content of the organohydrogenpolysiloxane is too low, the heat-conductive silicone composition may cure insufficiently. If the content of the organohydrogenpolysiloxane is too high, the heat-conductive silicone composition may cure into a very hard product (silicone rubber), giving rise to problems like generation of many cracks on the surface.

The platinum-based catalyst is used with the organohydrogenpolysiloxane for promoting cure of the heat-conductive silicone composition. Examples include chloroplatinic acid, chloroplatinic acid in alcohols, and complexes of platinum with olefins, alkenylsiloxanes, and carbonyl.

The amount of the platinum-based catalyst is not particularly limited. The platinum-based catalyst may be used in a catalytic amount, which is typically 0.01 to 1,000 ppm, preferably 0.1 to 500 ppm of platinum group metal based on the weight of component (a). If the amount of the catalyst is too low, the heat-conductive silicone composition may cure insufficiently. Too much amounts of the catalyst may be uneconomical because the cure rate of the heat-conductive silicone composition is saturated.

When the curing agent (b) is an organic peroxide, suitable organic peroxides include benzoyl peroxide, 2-methylbenzoyl peroxide, dicumyl peroxide, 2,5-dimethyl-2,5-bis(t-butylperoxy)hexane, di-t-butyl peroxide, and t-butyl peroxybenzoate. The organic peroxide may be used alone or in admixture of two or more.

The amount of the organic peroxide added is typically in a range of 0.1 to 5 parts, preferably 0.5 to 3 parts by weight per 100 parts by weight of the organopolysiloxane (a).

[(c) Heat-Conductive Filler]

Examples of the heat-conductive filler as component (c) include inorganic powders such as aluminum oxide, zinc oxide, silicon oxide, silicon carbide, aluminum nitride, and boron nitride. The shape of the heat-conductive filler may be spherical, irregular, needle or plate, though not limited thereto.

Component (c) may be used alone or in admixture of two or more.

The average particle size of component (c) is preferably 1 μm to 50 μm, more preferably 1 μm to 20 μm. If the average particle size is too large, the sheet may have a rough surface, leading to an increase of thermal resistance. It is noted that the average particle size is a volume basis average particle size as measured by a particle size distribution analyzer Microtrac MT3300EX (Nikkiso Co., Ltd.).

The amount of component (c) added is typically in a range of 100 to 4,000 parts, preferably 200 to 2,500 parts by weight per 100 parts by weight of component (a). Too small amounts of component (c) may achieve insufficient thermal conductivity whereas too much amounts of component (c) may be difficult to compound uniformly in a heat-conductive silicone composition and adversely affect shaping process.

[(d) Surface Treating Agent]

Further, a surface treating agent as component (d) may be added to the heat-conductive silicone composition. The component (d-1) or (d-2) described below is preferably used as the surface treating agent.

Component (d-1)

Component (d-1) is an alkoxysilane compound having the general formula (2).

$$R^2_b R^3_c Si(OR^4)_{4-b-c} \qquad (2)$$

Herein $R^2$ is independently a $C_6$-$C_{15}$ alkyl group, $R^3$ is independently a substituted or unsubstituted $C_1$-$C_{12}$ monovalent hydrocarbon group, $R^4$ is independently a $C_1$-$C_6$ alkyl group, b is an integer of 1 to 3, c is an integer of 0 to 2, and b+c is an integer of 1 to 3.

In formula (2), examples of the alkyl group $R^2$ include hexyl, octyl, nonyl, decyl, dodecyl, and tetradecyl. When the alkyl group $R^2$ has 6 to 15 carbon atoms, component (d-1) has an ability to wet component (c), is easy to handle, and provides the heat-conductive silicone composition with good low-temperature properties.

Examples of the substituted or unsubstituted monovalent hydrocarbon group represented by $R^3$ include alkyl groups such as methyl, ethyl, propyl, isopropyl, butyl, isobutyl, t-butyl, pentyl, neopentyl, hexyl, heptyl, octyl, nonyl, decyl, and dodecyl, cycloalkyl groups such as cyclopentyl, cyclohexyl, and cycloheptyl, aryl groups such as phenyl, tolyl, xylyl, naphthyl, and biphenyl, aralkyl groups such as benzyl, phenylethyl, phenylpropyl, and methylbenzyl, or substituted forms of the foregoing groups in which some or all hydrogen atoms bonded to carbon atoms are substituted by halogen atoms (e.g., fluorine, chlorine and bromine), cyano or the like, such as chloromethyl, 2-bromoethyl, 3-chloropropyl, 3,3,3-trifloropropyl, chlorophenyl, fluorophenyl, cyanoethyl, and 3,3,4,4,5,5,6,6-nonafluorohexyl. Typically, the substituted or unsubstituted monovalent hydrocarbon group has 1 to 10 carbon atoms, more typically 1 to 6 carbon atoms. Preferred are substituted or unsubstituted $C_1$-$C_3$ alkyl groups such as methyl, ethyl, propyl, chloromethyl, bromoethyl, 3,3,3-trifluoropropyl, and cyanoethyl, and substituted or unsubstituted phenyl groups such as phenyl, chlorophenyl, and fluorophenyl.

Examples of the alkyl group represented by $R^4$ include methyl, ethyl, propyl, isopropyl, butyl, isobutyl, t-butyl, pentyl, neopentyl, and hexyl. Inter alia, methyl and ethyl are preferred.

Preferred examples of component (d-1) are given below.

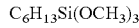

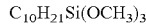

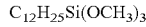

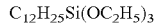

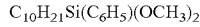

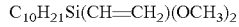

Component (d-1) may be used alone or in admixture of two or more.

Component (d-2)

Component (d-2) is a dimethylpolysiloxane capped with a trialkoxysilyl group at one end of the molecular chain, represented by the general formula (3).

[Chem. 1]

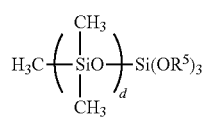

(3)

Herein $R^5$ is independently a $C_1$-$C_6$ alkyl group and d is an integer of 5 to 100, preferably 5 to 50.

In formula (3), the alkyl group $R^5$ is as exemplified above for $R^4$ in formula (2), with methyl and ethyl being preferred.

Preferred examples of component (d-2) are given below.

[Chem. 2]

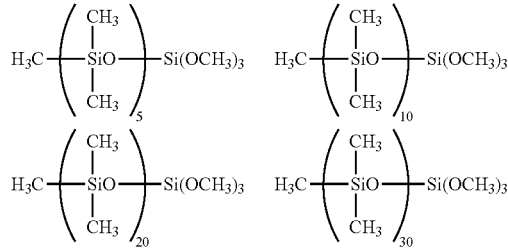

Component (d-2) may be used alone or in admixture of two or more.

Either one or both of components (d-1) and (d-2) may be used as the surface treating agent (d).

The amount of component (d), if used, is preferably 5 to 80 parts, more preferably 10 to 50 parts by weight per 100 parts by weight of component (a). If the amount of component (d) is too much, component (c) may oil bleed over time, causing contamination of an actual device. If the amount of component (d) is too small, component (a) may not be fully loaded with component (c).

[Other Components]

As long as the objects of the invention are not impaired, the heat-conductive silicone composition may contain other additives. Examples of the additives include reinforcing silica such as fumed silica and precipitated silica; plasticizers such as silicone oil and silicone wetter, flame retardant agents such as platinum, titanium oxide, and benzotriazole; acetylene compound-based addition reaction retarders such as 1-ethynyl-1-cyclohexanol; colorants such as organic pigments and inorganic pigments; heat resistance improvers such as iron oxide and cerium oxide; internal parting agents; and solvents such as toluene.

[Method for Preparing Heat-Conductive Silicone Composition]

The heat-conductive silicone composition is prepared by intimately mixing the above components. Preparation may also be conducted by the following method.

On a mixer such as a kneader, Banbury mixer, planetary mixer or Shinagawa mixer, the organopolysiloxane (a) and the heat-conductive filler (c) are first kneaded while optionally heating at a temperature of at least about 100° C. In this kneading step, the additives such as reinforcing silica, plasticizer, and flame retardant may optionally be added and mixed as long as the thermal conductivity is not impaired.

The uniform mixture obtained from the kneading step is cooled to room temperature and filtered through a strainer or the like. On a two-roll mill, Shinagawa mixer or the like, a predetermined amount of the curing agent (b) is added to the mixture and kneaded again. In this re-kneading step, the additives such as acetylene compound-based addition reaction retarder, colorant, heat resistance improver, and internal parting agent may optionally be added and mixed.

[Method for Preparing Coating Material for Continuous Shaping]

The resulting heat-conductive silicone composition is advantageously used for continuous shaping. The composition may be used as a coating material directly, or if necessary, after the steps of adding a solvent such as toluene thereto and mixing the contents on a mixer such as a planetary mixer or kneader into a coating material.

[Curing Conditions of Heat-Conductive Silicone Composition]

In the case of addition reaction cure type, the heat-conductive silicone composition may be cured at 80 to 200° C., preferably 100 to 150° C. for 5 to 30 minutes, preferably 10 to 20 minutes. In the case of peroxide cure type, it may be cured at 100 to 200° C., preferably 110 to 180° C. for 5 to 20 minutes, preferably 5 to 15 minutes.

[Hardness of Cured Heat-Conductive Silicone Composition]

The cured product of the heat-conductive silicone composition (i.e., heat-conductive silicone rubber layer) should have a hardness of 60 to 96, preferably 80 to 96 on Durometer A scale. With too low a hardness, the rubber layer surface may be readily scratched during handling; and when the rubber layer is wound up in a roll form in continuous shaping, adjacent rubber layer surfaces may fuse together, and space maintenance is difficult. With too high a hardness, the sheet is less flexible and may crack upon bending. Notably, the hardness is measured on a laminate of two cured pieces of the heat-conductive silicone composition (each 6 mm thick) using Durometer Type A.

[Thermal Conductivity of Cured Heat-Conductive Silicone Composition]

The cured product of the heat-conductive silicone composition (i.e., heat-conductive silicone rubber layer) preferably has a thermal conductivity at 25° C. of at least 1.0 W/m-K, to more preferably at least 1.2 W/m-K. If the thermal conductivity is less than 1.0 W/m-K, heat-conductive properties are insufficient. The upper limit of thermal conductivity is usually less than 20 W/m-K, though not critical. The thermal conductivity may be measured by meter TPA-501 of Kyoto Electronics Mfg. Co., Ltd. (the same applies hereinafter).

[Non-Adhesive High-Hardness Heat-Conductive Silicone Rubber Sheet]

The non-adhesive high-hardness heat-conductive silicone rubber sheet includes a heat-conductive silicone rubber layer which is formed by curing the heat-conductive silicone composition defined above.

The non-adhesive high-hardness heat-conductive silicone rubber sheet may further include an intermediate reinforcing layer of glass cloth or polyimide for the purpose of strength enhancement. When glass cloth is used as the intermediate layer, it is preferably sealed with a heat-conductive silicone resin as described below.

[Glass Cloth]

The glass cloth used as the intermediate reinforcing layer preferably has a thickness of 30 µm to 50 µm and a basis weight of up to 30 g/m², more preferably a thickness of 30 µm to 45 µm and a basis weight of 5 g/m² to 25 g/m². Since glass cloth has a relatively low thermal conductivity, a thin glass cloth is preferred in view of thermal conduction. However, an extremely thin glass cloth tears easily due to a reduced strength and has poor formability.

[Heat-Conductive Silicone Resin]

The cured heat-conductive silicone composition described above may be used as the heat-conductive silicone resin for sealing the glass cloth. The cured composition preferably has a thermal conductivity at 25° C. of at least 1.0 W/m-K. If the thermal conductivity is less than 1.0 W/m-K, the glass cloth sealed with the heat-conductive silicone resin may have a reduced thermal conductivity, adversely affecting the overall thermal conductivity of the heat-conductive composite silicone rubber sheet.

[Method for Preparing Glass Cloth Sealed with Heat-Conductive Silicone Resin]

The heat-conductive silicone composition (coating material) defined above is applied to glass cloth. A glass cloth sealed with a heat-conductive silicone resin may be continuously prepared by using a coating system such as a comma coater, knife coater or kiss coater, equipped with a series of drying furnace, heating furnace and winder, continuously applying the heat-conductive silicone composition to the glass cloth, drying and evaporating solvents and the like, and heating at about 80 to about 200° C., preferably about 100 to about 150° C. in the case of addition reaction cure type, or at about 100 to about 200° C., preferably about 110 to about 180° C. in the case of peroxide cure type.

The sealed glass cloth preferably has a thickness of up to 100 more preferably up to 90 µm. If the thickness of the sealed glass cloth exceeds 100 the heat-conductive silicone rubber layer accounts for a small thickness proportion in the overall heat-conductive composite silicone rubber sheet, which is undesirable for thermal conductivity of the overall heat-conductive composite silicone rubber sheet.

[Method for Preparing Non-Adhesive High-Hardness Heat-Conductive Silicone Rubber Sheet]

A heat-conductive silicone composition (coating material) is applied to one side (surface) of the glass cloth sealed with a heat-conductive silicone resin, obtained in the above step. To this end, a coating system such as a comma coater, knife coater or kiss coater, equipped with a series of drying furnace, heating furnace and winder is used. A heat-conductive silicone rubber layer is laid on one side (surface) of the glass cloth sealed with a heat-conductive silicone resin by continuously applying a heat-conductive silicone composition to one side (front surface) of the glass cloth sealed with a heat-conductive silicone resin, drying and evaporating solvents and the like, and heating at about 80 to about 200° C., preferably about 100 to about 150° C. in the case of addition reaction cure type, or at about 100 to about 200° C., preferably about 110 to about 180° C. in the case of peroxide cure type. Similarly, the heat-conductive silicone rubber layer is laid on the other side (back surface) of the glass cloth sealed with a heat-conductive silicone resin by similarly applying a heat-conductive silicone composition (coating material) and heating. The heat-conductive silicone compositions of which the heat-conductive silicone rubber layers are made may be the same or different on the front and back surfaces. Thus, it is preferable that the heat-conductive silicone rubber layer is the outermost layer of the non-adhesive to high-hardness heat-conductive silicone rubber sheet.

[Thickness of Non-Adhesive High-Hardness Heat-Conductive Silicone Rubber Sheet]

In the heat-conductive composite silicone rubber sheet, the non-adhesive high-hardness heat-conductive silicone rubber sheet preferably has a total thickness of 50 µm to 900 µm, more preferably 60 µm to 700 µm. With too thin a total thickness, the heat-conductive filler may protrude from the non-adhesive high-hardness heat-conductive silicone rubber sheet, and the sheet surface may lose smoothness and become difficult to be overlaid with the acrylic pressure-sensitive adhesive layer described below. With too thick a total thickness, the non-adhesive silicone rubber sheet may widely vary in thickness, making it difficult to uniformly apply the pressure-sensitive adhesive layer thereon. Also the thermal resistance may greatly increase, failing to provide the desired heat dissipation properties.

[Acrylic Pressure-Sensitive Adhesive Layer]

The acrylic pressure-sensitive adhesive layer is formed by curing an acrylic pressure-sensitive adhesive composition comprising (X) 100 parts by weight of an acrylic pressure-sensitive adhesive having a hydroxyl group as a functional group and (Y) 0.05 to 5 parts by weight of a chelate curing agent. Preferably the acrylic pressure-sensitive adhesive layer has a thickness of 2 to 40 μm after curing. As used herein, the term "pressure-sensitive adhesive" refers to pressure-sensitive pressure-sensitive adhesive.

[(X) Acrylic Pressure-Sensitive Adhesive Having Hydroxyl Group as Functional Group]

The acrylic pressure-sensitive adhesive as component (X), which has a specific amount of hydroxyl group as a functional group, may be obtained by polymerization of a radically polymerizable unsaturated monomer using a polymerization initiator according to any prior art well-known polymerization methods, for example, solution polymerization, mass polymerization, and emulsion polymerization.

The radically polymerizable unsaturated monomer used herein must contain a specific amount of a hydroxyl-containing monomer and is preferably a monomer mixture containing a hydroxyl-containing monomer and an alkyl (meth)acrylate.

Examples of the hydroxyl-containing monomer include 2-hydroxyethyl (meth)acrylate, 2-hydroxypropyl (meth)acrylate, 2-hydrhoxybutyl (meth)acrylate, and ethyl 2-(hydroxymethyl) acrylate. The hydroxyl-containing monomer may be used alone or in admixture of two or more.

The content of the hydroxyl-containing monomer is 5 to 50 mol %, preferably 10 to 30 mol % based on the entire constituent monomers in the acrylic pressure-sensitive adhesive. If the content of the hydroxyl-containing monomer is less than 5 mol %, the acrylic pressure-sensitive adhesive layer fails in good adhesion to the non-adhesive high-hardness heat-conductive silicone rubber sheet even with the aid of the chelate curing agent described below. If the content of the hydroxyl-containing monomer exceeds 50 mol %, the resulting acrylic pressure-sensitive adhesive layer loses reworkability.

The alkyl (meth)acrylate is preferably alkyl (meth)acrylates having an alkyl group of 1 to 14 carbon atoms. Examples include acrylates and methacrylates of linear or branched aliphatic alcohols such as methyl (meth)acrylate, ethyl (meth)acrylate, propyl (meth)acrylate, isopropyl (meth)acrylate, butyl (meth)acrylate, isobutyl (meth)acrylate, hexyl (meth)acrylate, octyl (meth)acrylate, decyl (meth)acrylate, and dodecyl (meth)acrylate. Inter alia, the preferred alkyl (meth)acrylates have an alkyl group of 1 to 10 carbon atoms, more preferably 1 to 8 carbon atoms.

The content of the alkyl (meth)acrylate is preferably 50 to 95 mol %, more preferably 70 to 90 mol % based on the entire constituent monomers in the acrylic pressure-sensitive adhesive.

If necessary, monomers other than the alkyl (meth)acrylate and hydroxyl-containing monomer may be used. Examples include carboxyl-bearing monomers such as acrylic acid, methacrylic acid, maleic anhydride, maleic acid, itaconic acid, and crotonic acid, epoxy-bearing monomers such as glycidyl acrylate and glycidyl methacrylate, (meth)acrylamide monomers such as N-hydroxyalkyl (meth)acrylamides, N-alkoxyalkyl (meth)acrylamides, and methylol acrylamide, phosphate-bearing vinyl monomers, and vinyl monomers such as vinyl acetate, styrene, and butadiene. The content of the other monomer, if used, is preferably 5 to 45 mol % based on the entire constituent monomers in the acrylic pressure-sensitive adhesive, though not particularly limited.

The acrylic pressure-sensitive adhesive may be obtained by using a polymerization initiator selected from various polymerization initiators and properly controlling polymerization conditions such as an amount of the initiator and temperature. Typical polymerization initiators are peroxides and azo compounds. Suitable peroxides include ketone peroxides, peroxyketals, hydroperoxides, dialkylperoxides, and diacylperoxides.

The acrylic pressure-sensitive adhesive preferably has a glass transition temperature (Tg) of −70° C. to 0° C., more preferably −60° C. to −30° C. As long as the Tg is in the range of −70° C. to 0° C., the acrylic pressure-sensitive adhesive layer will tightly adhere to the non-adhesive high-hardness heat-conductive silicone rubber sheet.

The acrylic pressure-sensitive adhesive preferably has a weight average molecular weight (Mw) of 200,000 to 800,000, more preferably 300,000 to 600,000. When the Mw is within the range of 200,000 to 800,000, the cohesive force of the acrylic pressure-sensitive adhesive layer can be adjusted appropriate to obtain the desired adhesion. Notably. Mw is determined by gel permeation chromatography versus polystyrene standards (the same applies hereinafter).

[(Y) Chelate Curing Agent]

The chelate curing agent as component (Y) may be any well-known chelate curing agents. When the chelate curing agent is blended with the acrylic pressure-sensitive adhesive, the acrylic pressure-sensitive adhesive layer obtained by heat curing the blend is given a cohesive force so that the acrylic pressure-sensitive adhesive layer establishes good adhesion to the non-adhesive high-hardness heat-conductive silicone rubber sheet as a substrate.

Examples of the well-known chelate curing agent include titanium chelate curing agents, aluminum chelate curing agents, and zirconium chelate curing agents. Although these chelate curing agents may be used alone or in admixture, the aluminum chelate curing agents are advantageous in establishing good adhesion to the non-adhesive high-hardness heat-conductive silicone rubber sheet.

Well-known ligands of the chelate curing agent are ethyl acetoacetate, ethylacetone, and acetylacetone. In the case of aluminum chelate curing agents, examples include aluminum ethylacetoacetate diisopropylate, aluminum tris(ethylacetoacetate), aluminum alkylacetoacetate diisopropylate, aluminum monoacetylacetonate bis(ethylacetoacetate), and aluminum tris(acetylacetonate). Inter alia, those curing agents having an acetylacetone ligand are preferred from the aspect of shelf stability of a coating solution of a blend of component (X) and the curing agent.

The total amount of the chelate curing agent added is 0.05 to 5 parts, preferably 0.5 to 3 parts by weight per 100 parts by weight of the acrylic pressure-sensitive adhesive. If the amount of the chelate curing agent is less than 0.05 part by weight, the resulting acrylic pressure-sensitive adhesive layer dose not exert a cohesive force, failing to establish good adhesion to the non-adhesive high-hardness heat-conductive silicone rubber sheet. Also, the resulting acrylic pressure-sensitive adhesive layer loses reworkability on an actual device. If the amount exceeds 5 parts by weight, the pressure-sensitive adhesive layer loses the ability to wet adherends, failing to provide the desired bonding force. Also, the chelate curing agent may be leached out of the acrylic pressure-sensitive adhesive layer over time.

Besides (X) the acrylic pressure-sensitive adhesive having a specific amount of hydroxyl group as a functional group and (Y) the chelate curing agent, (Z) a tackifier resin may be added to the acrylic pressure-sensitive adhesive composition, if necessary.

[(Z) Tackifier Resin]

Various tackifier resins may be used as component (Z) without any limitation. Examples include rosin resins, modified rosin resins, terpene resins, terpene phenolic resins, aromatic-modified terpene resins, C5 and C9 petroleum resins, and coumarone resins. These tackifier resins may be used alone or in admixture of two or more.

The amount of the tackifier resin added is preferably up to 5 parts by weight per 100 parts by weight of the acrylic pressure-sensitive adhesive. If the amount of the resin exceeds 5 parts by weight, the pressure-sensitive adhesive layer may lose the ability to wet adherends, failing to provide the desired bonding force. When added, the resin is is preferably added in an amount of at least 0.05 part by weight.

[Method of Preparing Acrylic Pressure-Sensitive Adhesive Composition]

The acrylic pressure-sensitive adhesive composition may be prepared by charging a mixer or the like with (X) the acrylic pressure-sensitive adhesive having a hydroxyl group as a functional group, (Y) the chelate curing agent, and optionally (Z) the tackifier resin all at once and mixing them.

If necessary, the acrylic pressure-sensitive adhesive composition may be diluted with a solvent such as xylene or toluene to form a coating solution. The coating solution typically has a viscosity of 200 to 1,000 mPa·s. If the viscosity is lower than 200 mPa·s, the coating solution may drip, leading to variations in the thickness of the resulting acrylic pressure-sensitive adhesive layer. If the viscosity exceeds 1,000 mPa·s, the coating solution may contain voids, forming an acrylic pressure-sensitive adhesive layer with an increased thermal resistance or appearance defects.

[Curing Conditions of Acrylic Pressure-Sensitive Adhesive Composition]

The resulting acrylic pressure-sensitive adhesive composition or the coating solution thereof may be cured at 80 to 150° C., preferably 80° C. to 140° C. for 1 to 20 minutes, preferably 2 to 10 minutes.

[Thickness of Acrylic Pressure-Sensitive Adhesive Layer]

The acrylic pressure-sensitive adhesive layer in the heat-conductive composite silicone rubber sheet preferably has a thickness in a range of 2 to 40 μm, more preferably 5 to 15 μm. A thickness of less than 2 μm may fail to exert the desired bonding force to an actual device. An acrylic pressure-sensitive adhesive layer in excess of 40 μm may provide the composite silicone rubber sheet with a substantially increased thermal resistance, and may lose reworkability due to the excessive bonding force.

[Method for Preparing Heat-Conductive Composite Silicone Rubber Sheet]

The coating solution of the acrylic pressure-sensitive adhesive composition obtained in the above step is applied to one surface of the non-adhesive high-hardness heat-conductive silicone rubber sheet. Using a coating system such as a comma coater, knife coater or kiss coater, equipped with a series of drying furnace, heating furnace and winder, a heat-conductive composite silicone rubber sheet having the acrylic pressure-sensitive adhesive layer on one surface is obtained by continuously applying the coating solution to the non-adhesive high-hardness heat-conductive silicone rubber sheet, preferably to the heat-conductive silicone rubber layer, drying and evaporating solvents and the like, and heating at about 80 to about 180° C., preferably about 80 to about 150° C. to cure. As described above, the heat-conductive composite silicone rubber sheet of the invention can be obtained by a simple fabrication process comprising the steps of directly applying the coating solution of the acrylic pressure-sensitive adhesive composition to one surface of the non-adhesive high-hardness heat-conductive silicone rubber sheet and heat curing the composition.

Preferably, the heat-conductive composite silicone rubber sheet is covered on its acrylic pressure-sensitive adhesive layer with a protective sheet such as PET separator and is wound up in a roll form.

[Measurement of Bonding Force of Acrylic Pressure-Sensitive Adhesive Layer in Heat-Conductive Composite Silicone Rubber Sheet]

The bonding force of the acrylic pressure-sensitive adhesive layer is measured according to JIS C 2107. The test procedure includes cutting the heat-conductive composite silicone rubber sheet into a sample of 25 mm wide, attaching the sample at its acrylic pressure-sensitive adhesive layer side to a stainless steel (SUS) plate of 10 mm thick, pressing them under a 2-kg roller 5 back-and-forth strokes, allowing the sample to stand at 25° C. for 30 minutes, peeling the sample from the steel plate over a distance of 200 mm at a pulling rate of 300 mm/min using a constant speed tensile tester, and measuring the stress generated upon peeling, which is reported as bonding force. The bonding force is preferably 0.05 to 1.0 (N/25 mm), more preferably 0.1 to 0.5 (N/25 mm). With a bonding force of less than 0.05 N/25 mm, it may be difficult to attach the heat-conductive composite silicone rubber sheet to a desired mounting position because of a shortage of bonding force. With a bonding force of more than 1.0 N/25 mm, reworkability on an actual device may be lost and residues of the acrylic pressure-sensitive adhesive layer may be left after peeling thereof.

EXAMPLES

Examples and Comparative Examples of the invention are given below by way of illustration and not by way of limitation.

[Preparation of Non-Adhesive High-Hardness Heat-Conductive Silicone Rubber Sheet]

The components used in Examples and Comparative Examples are shown below.

Component (a): dimethylvinylsiloxy-endcapped dimethylpolysiloxane having an average degree of polymerization of 8,000

Component (b): 2-methylbenzoyl peroxide

Component (c): (c-1) Irregular aluminium oxide having an average particle size of 1 μm
(c-2) Spherical aluminium oxide having an average particle size of 10 μm Component (d): dimethylpolysiloxane capped with a trimethoxysilyl group at one end, represented by the following formula (4)

[Chem. 3]

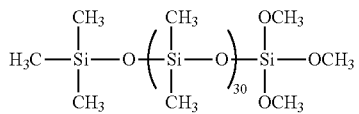

(4)

Component (e): dimethylpolysiloxane as a plasticizer, represented by the following formula (5)

[Chem. 4]

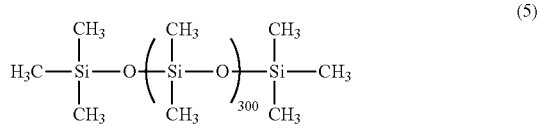

(5)

(Glass Cloth)

A glass cloth having a thickness of 40 μm and a basis weight of 25 g/m²

A heat-conductive silicone composition was obtained by feeding components (a), (b), (c-1), (c-2), (d) and (e) into a Banbury mixer and kneading for 20 minutes. Toluene was added to the heat-conductive silicone composition in an amount of 20 wt % based on the composition, which was kneaded on a planetary mixer into a coating material.

The coating material was applied to the glass cloth using a comma coater. The comma coater had a width of 1,300 mm and an effective oven length of 15 m. The 15-m oven was divided into three zones of 5 m length and the temperature of each zone was independently adjustable. The temperatures of the zones were 80° C., 150° C., and 180° C. from the comma roll side. Coating speed was 2 m/min. By continuously applying the coating material to the glass cloth and winding on a take-up roll, the glass cloth sealed with a heat-conductive silicone resin (cured heat-conductive silicone composition) was prepared. The sealed glass cloth was 80 μm thick.

The same coating material was applied on the sealed glass cloth with the same comma coater for glass cloth sealing under the same coating conditions as above. After the sealed glass cloth is coated on one surface and wound up, the glass cloth was similarly coated on the back surface and wound up. There was obtained a non-adhesive high-hardness heat-conductive silicone rubber sheet consisting of the sealed glass cloth and the heat-conductive silicone rubber layers on both sides thereof and having a total thickness of 200 μm.

[Preparation of Heat-Conductive Composite Silicone Rubber Sheet]

The components used in Examples and Comparative Examples are given below.

Component (X): acrylic pressure-sensitive adhesive having a hydroxyl group as a functional group (X-1) Acrylic pressure-sensitive adhesive containing butyl acrylate (A), methyl acrylate (B), and ethyl 2-(hydroxymethyl) acrylate (C) as main monomers, and having a Mw of 500,000, a compositional ratio of monomers (A):(B):(C)=40:40:20, and a Tg of −50° C.

(X-2) Acrylic pressure-sensitive adhesive containing butyl acrylate (A), methyl acrylate (B), and ethyl 2-(hydroxymethyl) acrylate (C) as main monomers, and having a Mw of 500,000, a compositional ratio of monomers (A):(B):(C)=50:48:2, and a Tg of −50° C.

(X-3) Acrylic pressure-sensitive adhesive containing butyl acrylate (A), methyl acrylate (B), and ethyl 2-(hydroxymethyl) acrylate (C) as main monomers, and having a Mw of 500,000, a compositional ratio of monomers (A):(B):(C)=20:10:70, and a Tg of −50° C.

Component (Y): chelate curing agent (Y-1) Aluminum chelate curing agent: aluminum tris(acetylacetonate) $Al(C_5H_7O_2)_3$ (Y-2) Titanium chelate curing agent: titanium tetra(acetylacetonate) $Ti(C_5H_7O_2)_4$ (Y-3) Zirconium chelate curing agent: zirconium tetra(acetylacetonate) $Zr(C_5H_7O_2)_4$ Component (Z): tackifier resin (Z-1) Rosin-based tackifier resin (KE-311, Arakawa Chemical Industries, Ltd.)

A coating solution of acrylic pressure-sensitive adhesive composition having a viscosity of 700 mPa·s was prepared by appropriately charging a Shinagawa mixer with components (X), (Y), (Z) and xylene and stirring at 500 Hz for 15 minutes. This coating solution was applied to one surface of the non-adhesive high-hardness heat-conductive silicone rubber sheet using the comma coater specified above. The temperatures of drying zones were 80° C., 120° C., and 140° C., from the comma roll side. Coating speed was 8 m/min. A heat-conductive composite silicone rubber sheet was obtained by continuously applying the coating solution to the non-adhesive high-hardness heat-conductive silicone rubber sheet and heat drying the coated sheet to form an acrylic pressure-sensitive adhesive layer, laminating the acrylic pressure-sensitive adhesive layer with a silicone-treated PET film as a release film, and winding up the laminate. Also, the acrylic pressure-sensitive adhesive layer having a desired thickness could be obtained by adjusting the gap of the head in the comma coater.

[Evaluation Methods]

Hardness of heat-conductive silicone rubber:

The heat-conductive silicone composition was cured into a heat-conductive silicone rubber sheet of 6 mm thick under curing conditions of 140° C./10 minutes. A laminate of two heat-conductive silicone rubber sheets was measured for hardness by Durometer A.

Thermal conductivity of heat-conductive silicone rubber:

The heat-conductive silicone composition was cured into a heat-conductive silicone rubber sheet of 6 mm thick under curing conditions of 140° C./10 minutes. The heat-conductive silicone rubber sheet was measured for thermal conductivity by TPA-501 (Kyoto Electronics Mfg. Co., Ltd.).

Thickness of acrylic pressure-sensitive adhesive layer in heat-conductive composite silicone rubber sheet:

The thickness of the acrylic pressure-sensitive adhesive layer was computed by measuring the thickness of the heat-conductive composite silicone rubber sheet having the acrylic pressure-sensitive adhesive layer by means of a micrometer gauge, and subtracting the thickness of non-adhesive high-hardness heat-conductive silicone rubber sheet from the measured value.

Bonding force of acrylic pressure-sensitive adhesive layer in heat-conductive composite silicone rubber sheet:

The bonding force of the acrylic pressure-sensitive adhesive layer was measured according to JIS C 2107, specifically by attaching the heat-conductive composite silicone rubber sheet (25 mm wide) on its pressure-sensitive adhesive layer side to a SUS plate, allowing it to stand at 25° C. for 30 minutes, conducting a 180° peeling test, and measuring the force required for peeling. A protective film was attached to the pressure-sensitive adhesive layer side of the heat-conductive composite silicone rubber sheet, which was aged at 60° C. for 2 months, after which the bonding force measurement was performed again to evaluate the age stability of the acrylic pressure-sensitive adhesive layer.

Reworkability of heat-conductive composite silicone rubber sheet:

The reworkability was rated good (O) when no acrylic pressure-sensitive adhesive layer residues having a diameter of at least 1 mm were left on the SUS plate in the above peeling test and poor (X) when acrylic pressure-sensitive adhesive layer residues having a diameter of at least 1 mm were left. In the case of poor reworkability, the bonding force was reported as not detectable (ND).

TABLE 1

|  | Components (pbw) |  | Example 1 | Example 2 | Example 3 | Example 4 | Example 5 | Example 6 |
|---|---|---|---|---|---|---|---|---|
|  | (a) |  | 100 | 100 | 100 | 100 | 100 | 100 |
|  | (b) |  | 1.0 | 1.0 | 1.0 | 1.0 | 1.0 | 1.0 |
| (c) |  | (c-1) | 560 | 560 | 560 | 560 | 560 | 560 |
|  |  | (c-2) | 1,680 | 1,680 | 1,680 | 1,680 | 1,680 | 1,680 |
|  | (c) in total |  | 2,240 | 2,240 | 2,240 | 2,240 | 2,240 | 2,240 |
|  | (d) |  | 40 | 40 | 40 | 40 | 40 | 40 |
|  | (e) |  | 15 | 15 | 15 | 15 | 15 | 15 |
|  | (X-1) |  | 100 | 100 | 100 | 100 | 100 | 100 |
|  | (Y-1) |  | 1.0 | — | — | 1.0 | — | — |
|  | (Y-2) |  | — | 1.5 | — | — | 2.5 | — |
|  | (Y-3) |  | — | — | 2.0 | — | — | 3.0 |
|  | (Z-1) |  | — | 0.1 | — | 1.0 | 2.5 | 2.0 |
|  | Evaluation results |  |  |  |  |  |  |  |
|  | Hardness (Durometer A) |  | 90 | 90 | 90 | 90 | 90 | 90 |
|  | Thermal conductivity (W/m-K) |  | 3.4 | 3.4 | 3.4 | 3.4 | 3.4 | 3.4 |
|  | Thickness of pressure-sensitive adhesive layer (μm) |  | 10 | 10 | 10 | 10 | 10 | 10 |
|  | Reworkability |  | ○ | ○ | ○ | ○ | ○ | ○ |
|  | Initial bonding force (N/25 mm) |  | 0.27 | 0.37 | 0.41 | 0.15 | 0.20 | 0.18 |
|  | Bonding force after 60° C./2 months (N/25 mm) |  | 0.26 | 0.33 | 0.36 | 0.14 | 0.18 | 0.15 |

TABLE 2

|  | Components (pbw) |  | Comparative Example 1 | Comparative Example 2 | Comparative Example 3 | Comparative Example 4 | Comparative Example 5 | Comparative Example 6 |
|---|---|---|---|---|---|---|---|---|
|  | (a) |  | 100 | 100 | 100 | 100 | 100 | 100 |
|  | (b) |  | 1.0 | 1.0 | 1.0 | 1.0 | 1.0 | 1.0 |
| (c) |  | (c-1) | 560 | 560 | 560 | 560 | 560 | 560 |
|  |  | (c-2) | 1,680 | 1,680 | 1,680 | 1,680 | 1,680 | 1,680 |
|  | (c) in total |  | 2,240 | 2,240 | 2,240 | 2,240 | 2,240 | 2,240 |
|  | (d) |  | 40 | 40 | 40 | 40 | 40 | 40 |
|  | (e) |  | 15 | 15 | 15 | 15 | 15 | 15 |
|  | (X-1) |  | 100 | 100 | — | — | 100 | 100 |
|  | (X-2) |  | — | — | 100 | — | — | — |
|  | (X-3) |  | — | — | — | 100 | — | — |
|  | (Y-1) |  | 0.01 | 8.0 | 2.0 | 3.5 | — | — |
|  | (Y-2) |  | — | — | — | — | 0.01 | — |
|  | (Y-3) |  | — | — | — | — | 0.01 | 7.0 |
|  | (Z-1) |  | — | — | — | — | 0.5 | 1.0 |
|  | Evaluation results |  |  |  |  |  |  |  |
|  | Hardness (Durometer A) |  | 90 | 90 | 90 | 90 | 90 | 90 |
|  | Thermal conductivity (W/m-K) |  | 3.4 | 3.4 | 3.4 | 3.4 | 3.4 | 3.4 |
|  | Thickness of pressure-sensitive adhesive layer (μm) |  | 10 | 10 | 10 | 10 | 10 | 10 |
|  | Reworkability |  | X | ○ | X | X | X | ○ |
|  | Initial bonding force (N/25 mm) |  | ND | 0.02 | ND | ND | ND | 0.03 |
|  | Bonding force after 60° C./2 months (N/25 mm) |  | ND | 0.02 | ND | ND | ND | 0.03 |

It is evident from the results that the heat-conductive composite silicone rubber sheets having an acrylic pressure-sensitive adhesive layer in Examples 1 to 6 exhibited no significant increase of thermal resistance and had excellent reworkability, and bonding force with no change over time. This is because the acrylic pressure-sensitive adhesive layer was formed by curing an acrylic pressure-sensitive adhesive composition comprising 100 pbw of an acrylic pressure-sensitive adhesive containing 5 to 50 mol % of a hydroxyl-containing monomer, 0.05 to 5 pbw of a chelate curing agent, and 0.05 to 5 pbw of a tackifier resin as an optional additive, and the acrylic pressure-sensitive adhesive layer had a thickness of 2 to 40 μm.

In Comparative Examples 1 and 5 wherein the amount of a chelate curing agent added to an acrylic pressure-sensitive adhesive composition of which the acrylic pressure-sensitive adhesive layer was formed was less than 0.05 pbw per 100 pbw of the acrylic pressure-sensitive adhesive, the chelate curing agent failed to impart sufficient cohesive force to the acrylic pressure-sensitive adhesive layer, leading to poor reworkability. In Comparative Examples 2 and 6 wherein the amount of a chelate curing agent added to an acrylic pressure-sensitive adhesive composition of which the acrylic pressure-sensitive adhesive layer was formed exceeded 5 pbw per 100 pbw of the acrylic pressure-sensitive adhesive, the acrylic pressure-sensitive adhesive layer became too hard to provide the desired bonding force.

In Comparative Example 3 wherein an acrylic pressure-sensitive adhesive composition of which the acrylic pressure-sensitive adhesive layer was formed used an acrylic pressure-sensitive adhesive containing less than 5 mol % of a hydroxyl-containing monomer, the resulting acrylic pressure-sensitive adhesive layer failed to provide good adhesion to the non-adhesive high-hardness heat-conductive silicone rubber sheet even with the aid of a chelate curing agent and lost reworkability. In Comparative Example 4 wherein an acrylic pressure-sensitive adhesive composition of which the acrylic pressure-sensitive adhesive layer was formed used an acrylic pressure-sensitive adhesive containing more than 50 mol % of a hydroxyl-containing monomer, the acrylic pressure-sensitive adhesive layer failed to improve cohesive force even with the aid of a chelate curing agent and lost reworkability.

The invention claimed is:

1. A method for preparing a heat-conductive composite silicone rubber sheet, the heat-conductive composite silicone rubber sheet comprising a non-adhesive high hardness heat-conductive silicone rubber sheet and an acrylic pressure-sensitive adhesive layer laid on one surface of the silicone rubber sheet, the non-adhesive high hardness heat-conductive silicone rubber sheet including a heat-conductive silicone rubber layer which is a cured product of a heat-conductive silicone composition containing a heat conductive filler, the cured product having a hardness of 60 to 96 on Durometer A scale and an intermediate reinforcing layer, and the acrylic pressure-sensitive adhesive layer being a cured product of an acrylic pressure-sensitive adhesive composition comprising 100 parts by weight of an acrylic pressure-sensitive adhesive composed of a polymer obtained from a monomer mixture containing 5 to 50 mol % of a hydroxyl-containing monomer, and 0.05 to 5 parts by weight of a chelate curing agent, the method comprising the steps of:

applying the heat-conductive silicone composition onto front surface and back surface of the intermediate reinforcing layer, and heat curing the heat-conductive silicone composition to obtain the non-adhesive high-hardness heat-conductive silicone rubber, and directly applying the acrylic pressure-sensitive adhesive composition comprising an acrylic pressure-sensitive adhesive and a chelate curing agent onto one surface of the obtained non-adhesive high-hardness heat-conductive silicone rubber sheet, and heat curing the acrylic pressure-sensitive adhesive composition for shaping.

2. The method of claim 1, wherein the acrylic pressure-sensitive adhesive composition further comprises 0.05 to 5 parts by weight of a tackifier resin.

* * * * *